(12) United States Patent
Tsai et al.

(10) Patent No.: US 11,424,275 B2
(45) Date of Patent: Aug. 23, 2022

(54) FLEXIBLE DISPLAY DEVICE

(71) Applicant: InnoLux Corporation, Miao-Li County (TW)

(72) Inventors: Kuo-Shun Tsai, Miao-Li County (TW); Chu-Hong Lai, Miao-Li County (TW); Yu-Chih Tseng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/013,835

(22) Filed: Sep. 7, 2020

(65) Prior Publication Data
US 2021/0098506 A1 Apr. 1, 2021

(30) Foreign Application Priority Data
Sep. 27, 2019 (CN) .......................... 201910925334.2

(51) Int. Cl.
| | |
|---|---|
| *H01L 27/12* | (2006.01) |
| *H01L 51/00* | (2006.01) |
| *H01L 51/52* | (2006.01) |
| *H01L 27/32* | (2006.01) |
| *G09F 9/30* | (2006.01) |
| *G02F 1/1333* | (2006.01) |

(52) U.S. Cl.
CPC .... *H01L 27/1244* (2013.01); *G02F 1/133305* (2013.01); *G09F 9/301* (2013.01); *H01L 27/1218* (2013.01); *H01L 27/32* (2013.01); *H01L 27/3276* (2013.01); *H01L 51/0097* (2013.01); *H01L 51/5212* (2013.01); *H01L 51/5228* (2013.01); *H01L 27/3211* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2007/0045621 A1* | 3/2007 | Suzuki | ............... H01L 27/1285 257/40 |
| 2009/0139753 A1 | 6/2009 | Kim | |
| 2015/0362811 A1 | 12/2015 | Huang | |

(Continued)

FOREIGN PATENT DOCUMENTS

| | | |
|---|---|---|
| CN | 101726874 A | 6/2010 |
| CN | 103681696 A | 3/2014 |
| CN | 104201152 A | 12/2014 |

*Primary Examiner* — Shaun M Campbell
*Assistant Examiner* — Aneta B Cieslewicz
(74) *Attorney, Agent, or Firm* — Winston Hsu (57) ABSTRACT

The present disclosure provides a flexible display device including a substrate, a first metal layer, a first insulating layer and a second insulating layer. The substrate includes an active region and a peripheral region adjacent to the active region. The first metal layer is disposed on the substrate. The first insulating layer is disposed on the first metal layer, and the first insulating layer includes a first via hole disposed in the peripheral region. The second insulating layer is disposed on the first insulating layer, and the second insulating layer includes a second via hole. In a top view direction of the flexible display device, the first via hole is disposed within the second via hole, and the second via hole exposes a portion of a top surface of the first insulating layer.

18 Claims, 8 Drawing Sheets

(56) References Cited

U.S. PATENT DOCUMENTS

| | | |
|---|---|---|
| 2016/0043101 A1 | 2/2016 | Liu |
| 2017/0338254 A1 | 11/2017 | Reit |
| 2019/0229130 A1* | 7/2019 | Ma ........................ H01L 27/124 |
| 2020/0257392 A1* | 8/2020 | Yang ..................... G06F 3/0446 |

* cited by examiner

FLEXIBLE DISPLAY DEVICE

BACKGROUND OF THE DISCLOSURE

1. Field of the Disclosure

The present disclosure relates to a display device; more particularly, a flexible display device having a bonding pad.

2. Description of the Prior Art

Flexible display devices are widely used in daily life, and display panels of flexible display devices may be driven by integrated circuit chips and flexible circuit boards. Therefore, how to improve the quality of electrical connections between the integrated circuit chips and the display panel or between the flexible circuit boards and the display panel, or how to improve the display quality or reliability of flexible display devices have become one of many important topics of discussion.

SUMMARY OF THE DISCLOSURE

To solve the abovementioned issues, an embodiment of the present disclosure provides a flexible display device including a substrate, a first metal layer, a first insulating layer and a second insulating layer. The substrate includes an active region and a peripheral region adjacent to the active region. The first metal layer is disposed on the substrate. The first insulating layer is disposed on the first metal layer, and the first insulating layer includes a first via hole disposed in the peripheral region. The second insulating layer is disposed on the first insulating layer, and the second insulating layer includes a second via hole. In a top view direction of the flexible display device, the first via hole is disposed within the second via hole, and the second via hole exposes a portion of a top surface of the first insulating layer.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure may be simplified schematic diagrams that partially illustrate a portion of an electronic device or a portion of a flexible display device; certain components within may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on," "disposed on" or "connected to" another element or layer, it can be directly on or directly connected to the other element or layer, or intervening elements or layers may be presented (indirect condition). In contrast, when an element is referred to as being "directly on" or "directly connected to" another element or layer, there are no intervening elements or layers presented.

The terms "about," "substantially," "equal," or "same" generally refer to values falling within 20% of a given value or range, or to values falling within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim. Additionally, the terms first, second, third, etc. may not indicate an order of production or process.

It should be noted that the technical features in different embodiments described in the following description may be replaced, recombined, or mixed with one another to constitute another embodiment without departing from the spirit of the present disclosure.

An electronic device according to the present disclosure may include a display device, an antenna device, a light-emitting device, a sensing device, or a tiled device, but not limited thereto. The electronic device may include foldable or flexible electronic devices. The display device may include a self-emitting type organic light-emitting diode (OLED), an inorganic light-emitting diode (LED) such as a mini light-emitting diode (mini LED), a micro light-emitting diode (micro LED), quantum dot (QD) materials, a quantum dot light-emitting diode (quantum dot LEDs, QLEDs, QDLEDs), fluorescent materials, phosphorescent materials, other suitable materials or a combination of the above materials and devices, but not limited thereto. Concepts or principles of the present disclosure may also be applied in non-self-emitting types of displays such as liquid crystal displays (LCDs), but not limited thereto.

The antenna device may for example be a liquid crystal antenna or other types of antenna devices, but the present disclosure is not limited thereto. The tiled device may for example be a tiled display device, a tiled antenna device or a combination thereof, but the present disclosure is not limited thereto. It should be noted that, the electronic device may be a combination of the aforementioned devices, but the present disclosure is not limited thereto. Additionally, an outer shape of the electronic device may be rectangular, spherical, polygonal, a shape with a curved edge or other suitable shapes. The electronic device may have driving systems, control systems, lighting systems, shelving systems etc. as peripheral systems to support the display device, the antenna device or the tiled device. In the following description, the flexible display device is illustrative of an example of the electronic device of the present disclosure, but the present disclosure is not limited thereto.

Figure 1:
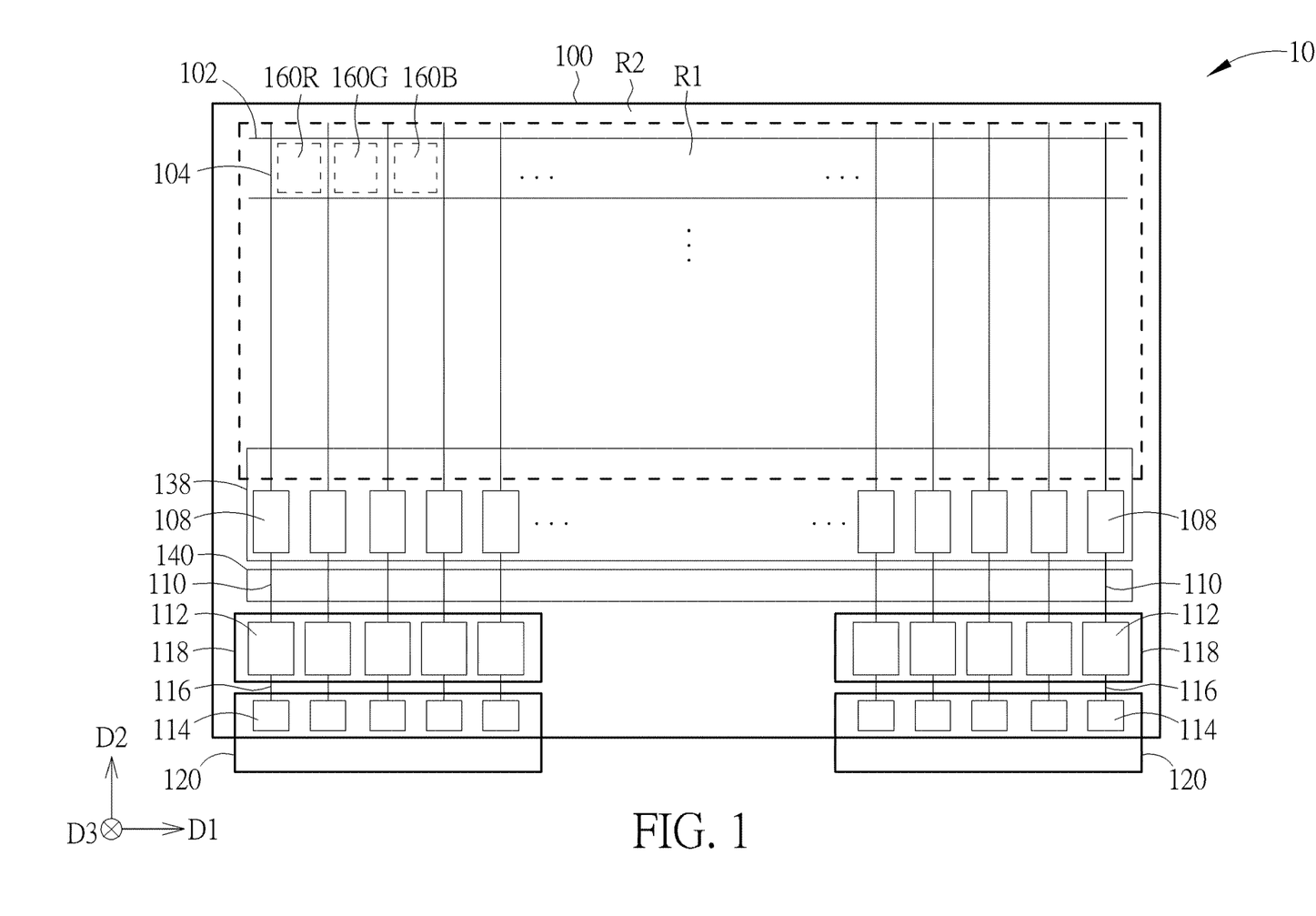
FIG. 1 is a top view of a flexible display device according to an embodiment of the present disclosure.

Please refer to FIG. 1, which illustrates a top view of a flexible display device according to a first embodiment of the present disclosure. The electronic device or the flexible display device 10 of the present embodiment may include a substrate 100 that may include an active region R1 and a peripheral region R2 adjacent to the active region R1, and the peripheral region R2 may for example be configured on at least one side of the active region R1. As shown in FIG. 1, the peripheral region R2 may surround the active region R1. The active region R1 may include a display region, a detection region, a sensing region, an emitting region, an operating region, other suitable regions or a combination of the aforementioned regions, but not limited thereto.

The substrate 100 may include a flexible substrate, but not limited thereto. Materials of the substrate 100 may include organic or inorganic flexible materials, but not limited thereto. If the material of the substrate 100 is an organic polymer, the substrate 100 may for example include polyimide (PI), polyethylene terephthalate (PET), polycarbonate (PC) or a combination of the aforementioned materials, but not limited thereto. Furthermore, a top-view shape of the substrate 100 may be a rectangle, a shape with a curved edge or any suitable shapes without limitation.

The flexible display device 10 may include a plurality of scan lines 102 and a plurality of data lines 104 disposed on the substrate 100. The scan lines 102 may extend along a first direction D1, the data lines 104 may extend along a second direction D2, and the second direction D2 is different from the first direction D1. The first direction D1 and the second direction D2 of the present embodiment may for example be perpendicular to each other, but not limited thereto. Additionally, the scan lines 102 may intersect the data lines 104 to define a plurality of sub-pixels, such as a sub-pixel 106R, a sub-pixel 106G, and a sub-pixel 106B in FIG. 1, but not limited thereto. For example, the sub-pixel 106R may correspond to a red sub-pixel, the sub-pixel 106G may correspond to a green sub-pixel, the sub-pixel 106B may correspond to a blue sub-pixel, and a color image may be displayed through light of different colors generated by the sub-pixels, but not limited thereto. The light provided by the sub-pixels may be designed based on demand. Furthermore, a top-view shape of the sub-pixel may be a rectangle, a parallelogram, a ">" shape, or any suitable shapes without limitation.

As shown in FIG. 1, the data lines 104 may extend from the active region R1 to the peripheral region R2 along the second direction D2, and at least one of the data lines 104 may be electrically connected to a transfer structure 108, but not limited thereto. The flexible display device 10 may include a plurality of transfer structures 108 disposed adjacent to the active region R1 and along the first direction D1 or along an edge of the active region R1, but not limited thereto. Using one of the transfer structures 108 as an illustrative example, it may be noticed that an end of the transfer structure 108 may be electrically connected to the data line 104, and another end of the transfer structure 108 may be electrically connected to a conductive line 110, but not limited thereto. The transfer structure 108 may also be electrically connected to other signal lines in the active region R1. Through the transfer structures 108, the data lines 104 in the active region R1 may be electrically connected to the conductive lines 110 in the peripheral region R2, or a metal layer of the data lines 104 may be electrically connected to another metal layer of the conductive lines 110 through the transfer structures 108. Herein, various metal layers of the flexible display device 10 may be produced or formed using a single production process and subsequently patterned to form different sections or layers; alternatively, the various metal layers may be produced and/or formed using separate production processes. For example, once a metal layer is formed on the substrate 100, the metal layer may be patterned using photolithography processes to divide the metal layer into various sections, shapes or thicknesses. The various sections of metal layers may also be formed separately using individual production processes, each process for producing a section of the metal layer. The production processes are not limited to those described above; any production process suitable for producing the metal layers may suffice.

The phrase "electrically connected to" of the present disclosure can refer to two conductors or semiconductors being directly connected to achieve electrical connectivity, or the phrase may refer to two conductors or semiconductors being connected through other elements to achieve electrical connectivity, but not limited thereto.

The flexible display device 10 may include a plurality of bonding pads 112 and a plurality of bonding pads 114 disposed on the substrate 100, and the bonding pads 112 and the bonding pads 114 may be disposed along the first direction D1, but not limited thereto. On the other hand, along the second direction D2, the transfer structures 108 may for example be disposed adjacent to the active region R1, the bonding pads 114 may for example be disposed adjacent to an edge of the substrate 100, and the bonding pads 112 may be disposed between the bonding pads 114 and the transfer structures 108, but not limited thereto. Using one of the bonding pads 112 as an illustrative example, it may be noticed that an end of the bonding pad 112 may be electrically connected to a conductive line 110, and another end of the bonding pad 112 may be electrically connected to a conductive line 116, but not limited thereto. Furthermore, an end of the conductive line 116 may be electrically connected to a bonding pad 112, and another end of the conductive line 116 may be electrically connected to a bonding pad 114, but not limited thereto. In such manner, the bonding pads 112 may be electrically connected to the bonding pads 114. Quantities and positions of the bonding pads 112, the bonding pads 114 and the transfer structures 108 are not limited to those shown in FIG. 1.

In some embodiments (not illustrated), some bonding pads 112 may not be electrically connected to the transfer structures 108, and may be electrically connected to other electrical components of the flexible display device 10 such as driver circuits, detection circuits, and/or sensing circuits through conductive lines, but not limited thereto.

The flexible display device 10 may include an integrated circuit chip 118 and a flexible circuit board 120. The integrated circuit chip 118 and the flexible circuit board 120 may be disposed on the substrate 100, the integrated circuit chip 118 may be electrically connected to the bonding pads 112, and the flexible circuit board 120 may be electrically connected to the bonding pads 114. For example, the integrated circuit chip 118 may include a plurality of bonding pads disposed on a surface of the integrated circuit chip 118, and at least a portion of the bonding pads of the integrated circuit chip 118 has positions corresponding to the bonding pads 112 and may be connected (e.g., electrically connected) to the bonding pads 112. On the other hand, the flexible circuit board 120 may include a plurality of bonding pads disposed on a surface of the flexible circuit board 120, and at least a portion of the bonding pads of the flexible circuit board 120 has positions corresponding to the bonding pads 114 and may be connected (e.g., electrically connected) to the bonding pads 114. Quantities and positions of the integrated circuit chip 118 and the flexible circuit board 120 are not limited to those shown in FIG. 1.

Figure 2:
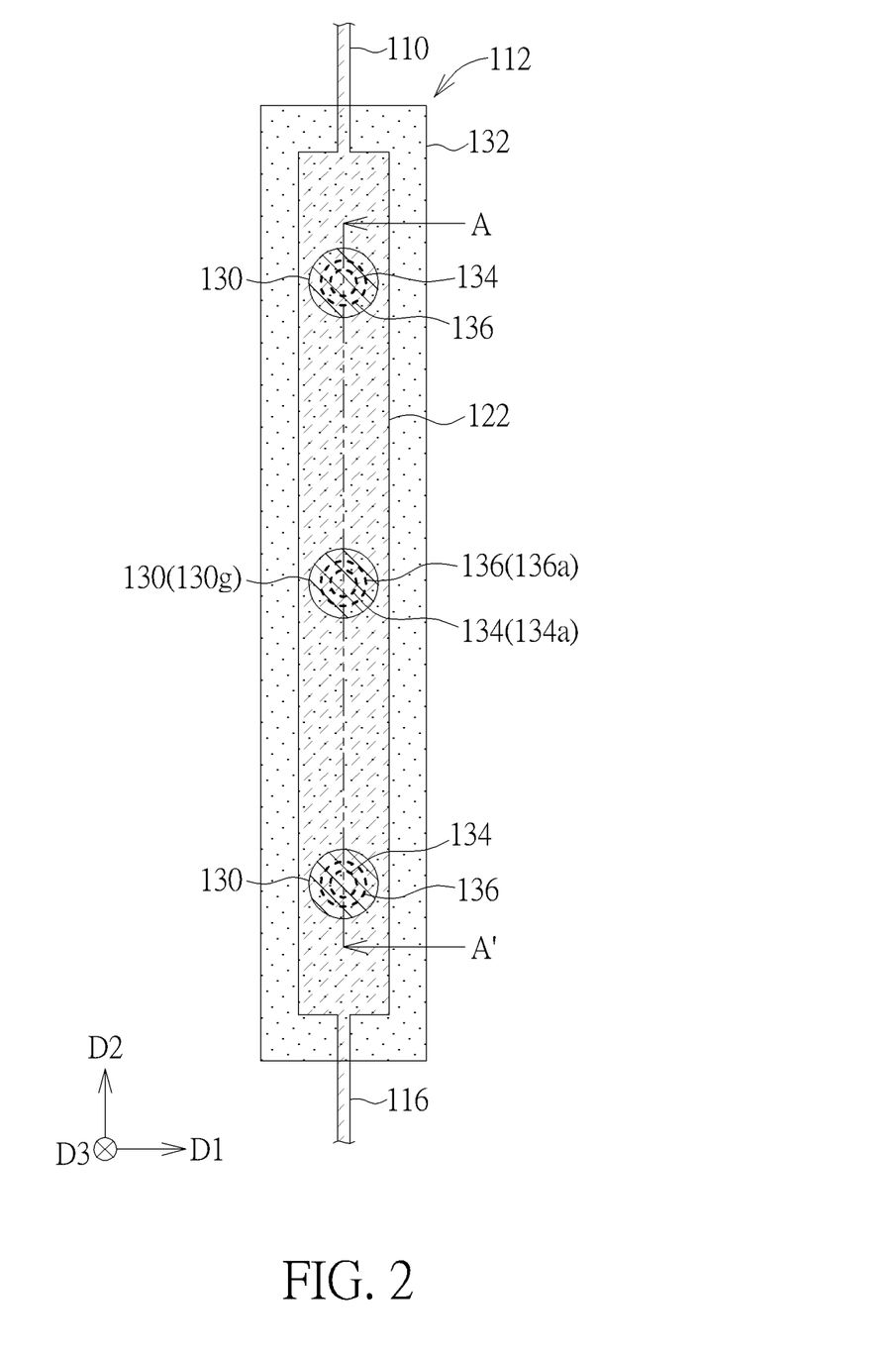
FIG. 2 is an enlarged schematic diagram of one of a plurality of bonding pads according to an embodiment of the present disclosure.
Figure 3:
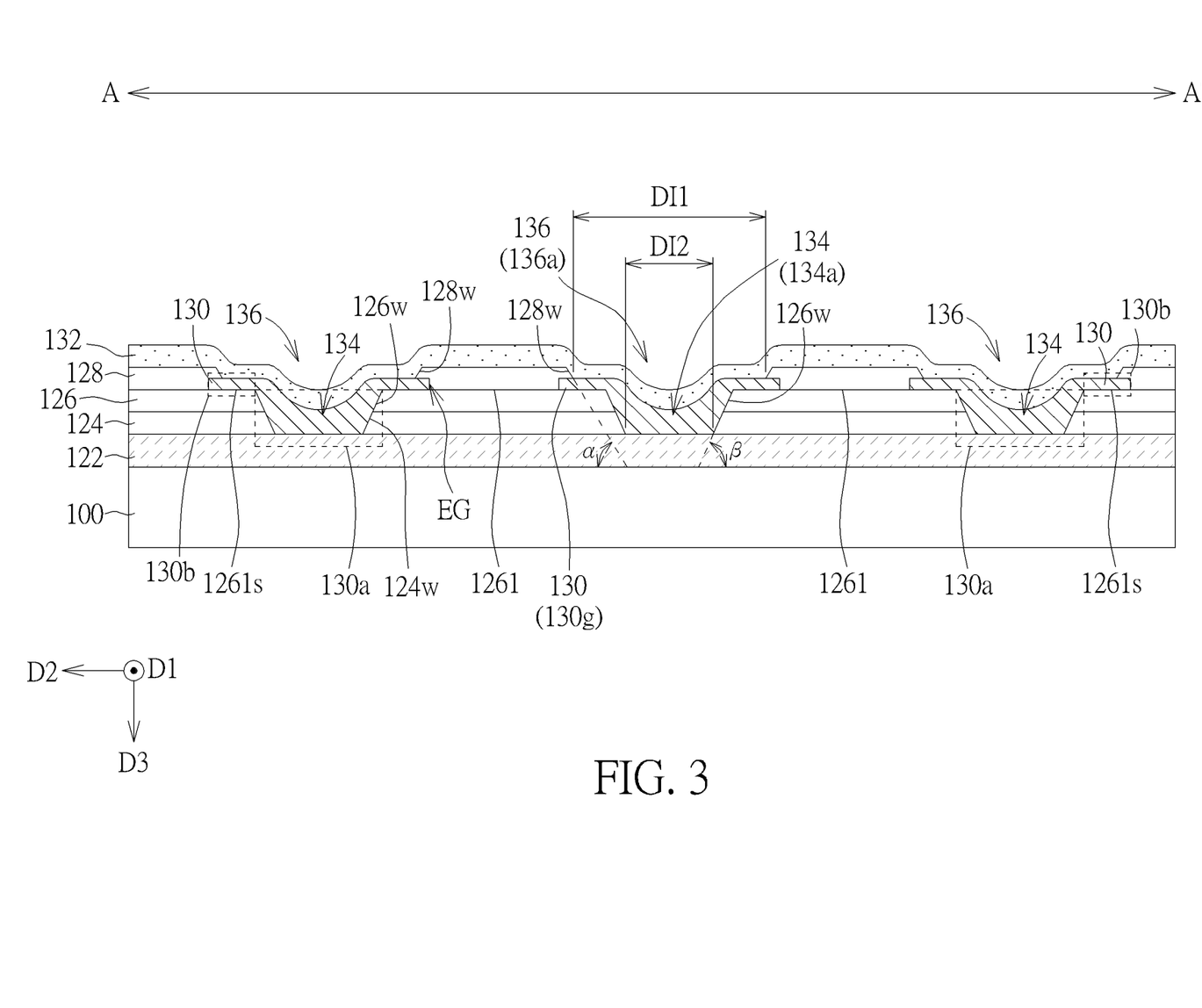
FIG. 3 is a schematic diagram of a sectional view along a section line A-A' in FIG. 2.

Please refer to FIG. 2 and FIG. 3, wherein FIG. 2 is an enlarged schematic diagram of one of the bonding pads 112 according to the first embodiment of the present disclosure, and FIG. 3 is a schematic diagram of a sectional view along a section line A-A' in FIG. 2. One of the bonding pads 112 of the flexible display device 10 may include a metal layer 122, an insulating layer 124, an insulating layer 126, an insulating layer 128, a plurality of transparent electrodes 130 and a transparent electrode 132, but not limited thereto. As shown in FIG. 2, the conductive line 110 and the conductive line 116 may be a linear portion extended from the metal layer 122; in some embodiments, the conductive line 110 and the conductive line 116 may be directly connected to the metal layer 122 of the bonding pad 112, but not limited thereto. As shown in FIG. 3, the insulating layer 124 and the insulating layer 126 may be disposed on the metal layer 122, and the insulating layer 124 and/or the insulating layer 126 may include a plurality of via holes 134. The via holes 134 may be disposed in the peripheral region R2 of the substrate 100, and the via holes 134 may penetrate through the insulating layer 124 and the insulating layer 126, such that a portion of a surface of the metal layer 122 may be exposed by the via holes 134. In some embodiments, one of the transparent electrodes 130 may be disposed in one of the via holes 134, and the transparent electrode 130 may directly contact the portion of the surface of the metal layer 122 exposed by the via holes such that the transparent electrode 130 may be electrically connected to the metal layer 122, but not limited thereto.

In some embodiments, quantities of the via holes 134 and quantities of via holes 136 are not limited to be more than one; in some embodiments, the bonding pads 112 or the bonding pads 114 may include one via hole 134 and one via hole 136. In a top view direction D3 of the flexible display device 10, the via holes 134 are disposed within the via holes 136 (as shown in FIG. 2). In some embodiments, as shown in FIG. 3, the insulating layer 128 comprises a side wall 128w surrounding the via hole 136, and the insulating layer 124 and the insulating layer 126 respectively comprise a side wall 124w and a side wall 126w surrounding the via hole 134. When viewed from centers of the via holes 134 and the via holes 136, the side wall 126w surrounding the via hole 134 may be disposed inside the side wall 128w surrounding the via hole 136. In some embodiments, the insulating layer 128 may be disposed on the insulating layer 126, and the insulating layer 128 may include a plurality of via holes 136. The via holes 136 may penetrate through the insulating layer 128 such that portions of a surface of the transparent electrode 130 may be exposed by the via holes 136. As shown in FIG. 3, one of the via holes 136 may expose a portion 1261s of atop surface 1261 of the insulating layer 126. Specifically, the transparent electrode 130 may include a portion 130a of the transparent electrode and a portion 130b of the transparent electrode, wherein the portion 130a of the transparent electrode 130 is disposed in the via hole 134, the portion 130b of the transparent electrode 130 is disposed on the portion 1261s of the top surface 1261 of the insulating layer 126. In some embodiments, the portion 130b of the transparent electrode 130 may cover the portion 1261s of the top surface 1261 while extending along a direction away from the via holes 134 to be disposed between the insulating layer 126 and the insulating layer 128, and along the top view direction D3, the side wall 128w may be disposed between an edge EG of the portion 130b of the transparent electrode 130 and the side wall 126w, but not limited thereto. In some embodiments, the portion 130b of the transparent electrode 130 directly contacts the insulating layer 126 and the insulating layer 128. In some embodiments, the edge EG of the portion 130b of the transparent electrode 130 may extend beyond the side wall 128w and the side wall 126w, but not limited thereto.

Additionally, the via holes 136 may have a diameter DI1, and the via holes 134 may have a diameter DI2. As shown in FIG. 3, the diameter DI1 may be obtained by measuring a minimum width of a bottom profile of the side wall 128w of the insulating layer 128, and the diameter DI2 may be obtained by measuring a minimum width of a bottom profile of the side wall 124w of the insulating layer 124, but not limited thereto. In the present embodiment, the diameter DI1 may be greater than the diameter DI2. The diameter DI1 of the via holes 136 may be greater than or equal to 15 micrometers and less than or equal to 20 micrometers, but not limited thereto.

Regarding measurements of the diameter DI1 and the diameter DI2, an optical microscope (OM), a scanning electron microscope (SEM), a profilometer (α-step), an ellipsometer or other methods suitable for measuring distance/thickness may be used when necessary. Specifically, in some embodiments, a scanning electron microscope is used to obtain a sectional image of a structure, and a minimum width seen in any sectional image is measured; or, an optical microscope is used to obtain a top-view image of a structure, and a minimum width seen in any top-view image is measured.

The transparent electrode 132 may be disposed on the insulating layer 128 and the transparent electrode 130, and the transparent electrode 132 may at least partially cover the insulating layer 128 and the transparent electrode 130, but not limited thereto. The transparent electrode 132 may be electrically connected to the metal layer 122 through the via holes 136 and the via holes 134. For example, the transparent electrode 132 may directly contact portions of the surface of the transparent electrode 130 exposed by the via holes 136, such that the transparent electrode 132 may be electrically connected to the metal layer 122 through the transparent electrodes 130, but not limited thereto. In some embodiments, since the transparent electrode 132 may fill into the via holes 136, portions of the top surface of the transparent electrode 132 on the via holes 136 may be concave surfaces. Similarly, portions of the top surface of the transparent electrode 130 on the via holes 134 may also be concave surfaces.

Additionally, as shown in FIG. 3, an included angle α is formed between the side wall 128w and the substrate 100, and the included angle α may be greater than or equal to 45 degrees and less than or equal to 60 degrees. Designing the included angle α to be greater than or equal to 45 degrees may improve the coverage of the transparent electrode 132 filled into the via holes 136. Furthermore, considering the limit of production equipment, the included angle α may be designed to be less than or equal to 60 degrees, but not limited thereto. An included angle β is formed between the side wall 124w and the substrate 100; in some embodiments, a range of the included angle β may be equal to a range of the included angle α and may have aforementioned functions, but not limited thereto. In some embodiments, the included angle β may be different from the included angle α, and a slope of the side wall 124w may be different from a slope of the side wall 128w. In some embodiments, the side wall 124w, the side wall 126w and the side wall 128w may have different slopes, or two of the side wall 124w, the side wall 126w, and the side wall 128w may have different slopes, but not limited thereto.

As shown in FIG. 2 and FIG. 3, in the bonding pad 112 of the present embodiment, the transparent electrodes 130 are not formed on the insulating layer 126 as a continuous surface. The transparent electrodes 130 of the present embodiment may be a plurality of separate electrodes (for example, transparent electrodes 130 and transparent electrodes 130g); the plurality of transparent electrodes 130 may be separately disposed in the corresponding via holes 134 and partially cover portions 1261s of the top surface 1261 of the insulating layer 126 adjacent to the via holes 134. The insulating layer 124 and/or the insulating layer 126 further comprise a via hole 134 (134a) adjacent to the via hole 134, the insulating layer 128 further comprises a via hole 136 (136a) adjacent to the via hole 136, and the via hole 134 (134a) is disposed within the via hole 136 (136a) in the top view direction D3. The transparent electrode 132 is electrically connected to the metal layer 122 through the via hole 136 (136a) and the via hole 134 (134a). One of the plurality of transparent electrodes 130 may be disposed within the via hole 134, and another one of the plurality of transparent electrodes 130 (130g) may be disposed within the via hole 134 (134a). The transparent electrode 132 is electrically connected to the metal layer 122 through one of the transparent electrodes 130 and another one of the transparent electrode 130 (130g), but the present disclosure is not limited thereto. The transparent electrode 130 is separate from another transparent electrode 130 (130g).

In such manner, a contact area of a heterogeneous interface between the transparent electrode 130 and the insulating layer 126 may be reduced, or a contact area of a heterogeneous interface between the transparent electrode 130 and the insulating layer 128 may be reduced, such that a probability of peeling or cracking due to the heterogeneous interfaces between dissimilar materials may be reduced. On the other hand, the present embodiment utilizes two via holes (such as the via hole 134 and the via hole 136) that penetrate through the insulating layer 124, the insulating layer 126 and the insulating layer 128. When compared to using only one via hole to penetrate the insulating layer 124, the insulating layer 126 and the insulating layer 128, methods utilized in the present embodiment can save process time or reduce the size of the via holes.

The bonding pads 114 may have structures and features similar to the bonding pads 112, as described above and shown in FIG. 2 and FIG. 3. In some embodiments, the bonding pads 114 may be designed to have a size (area) or a quantity of via holes that are different from the bonding pads 112, but not limited thereto. In some embodiments, an end of the bonding pads 114 may connect with the conductive lines 116, and another end of the bonding pads 114 may not be connected to the conductive lines.

Figure 4:
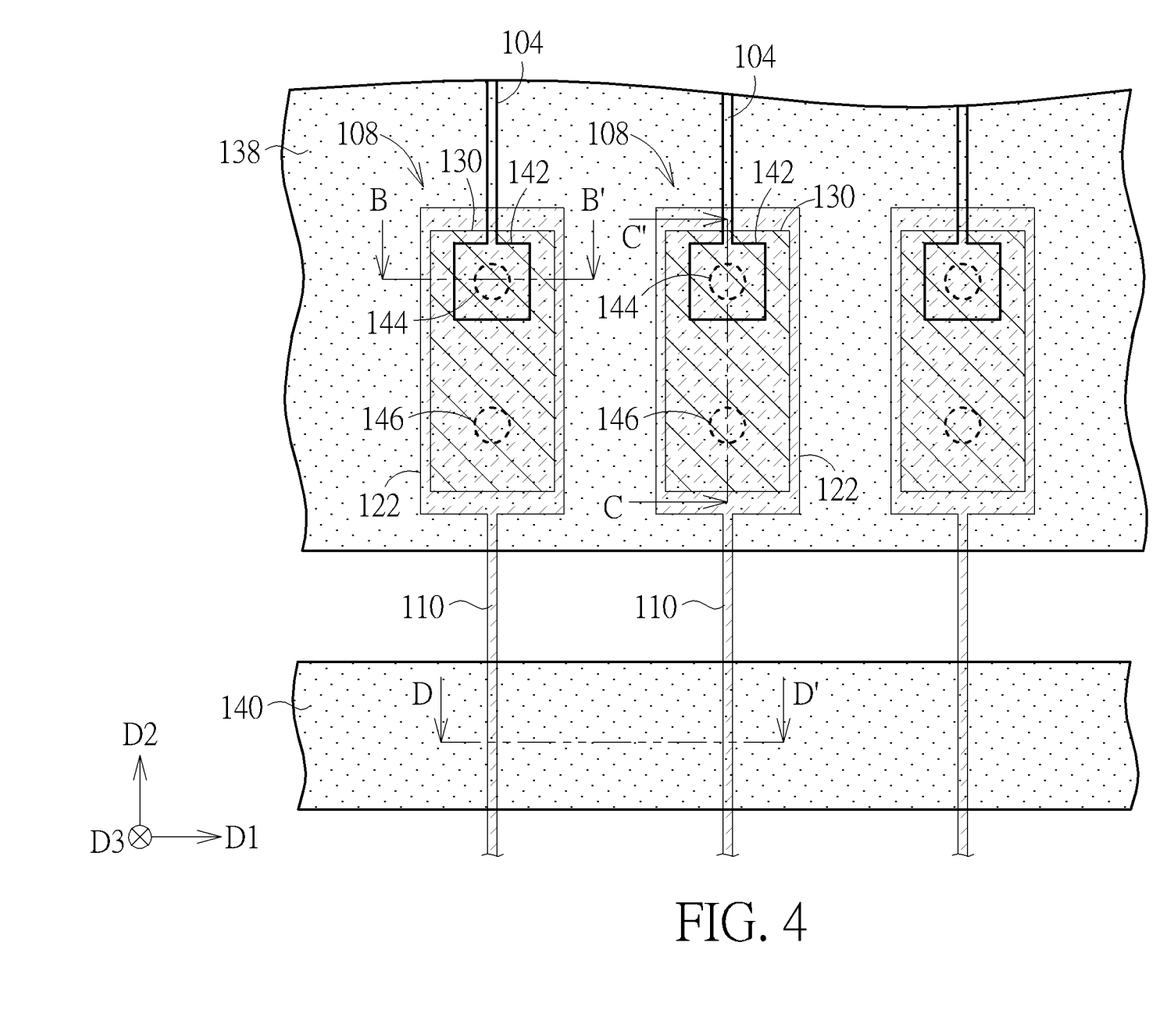
FIG. 4 is an enlarged schematic diagram of a transfer structure according to an embodiment of the present disclosure.
Figure 5:
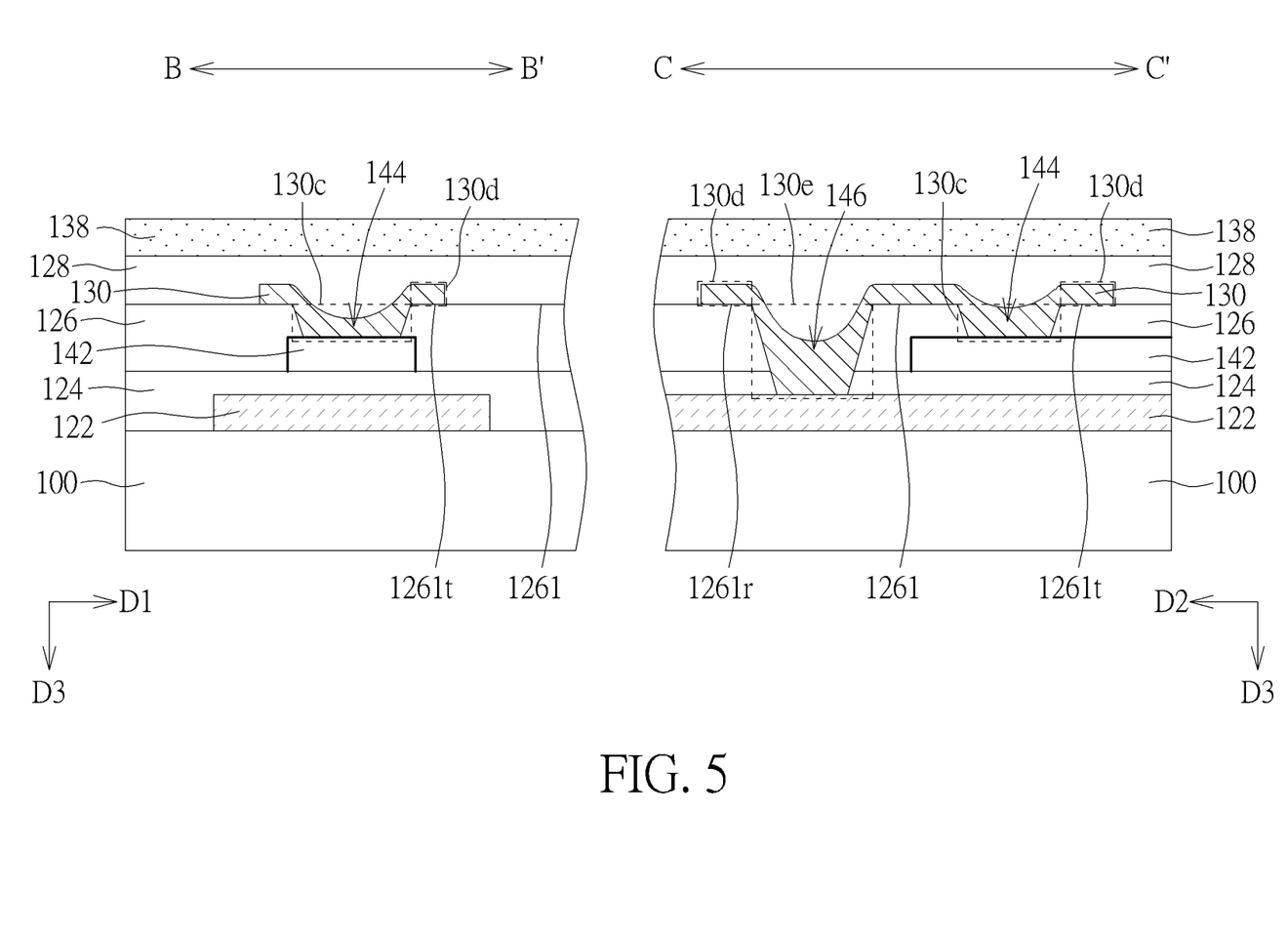
FIG. 5 illustrates schematic diagrams of sectional views along a section line B-B' and a section line C-C' in FIG. 4.
Figure 6:
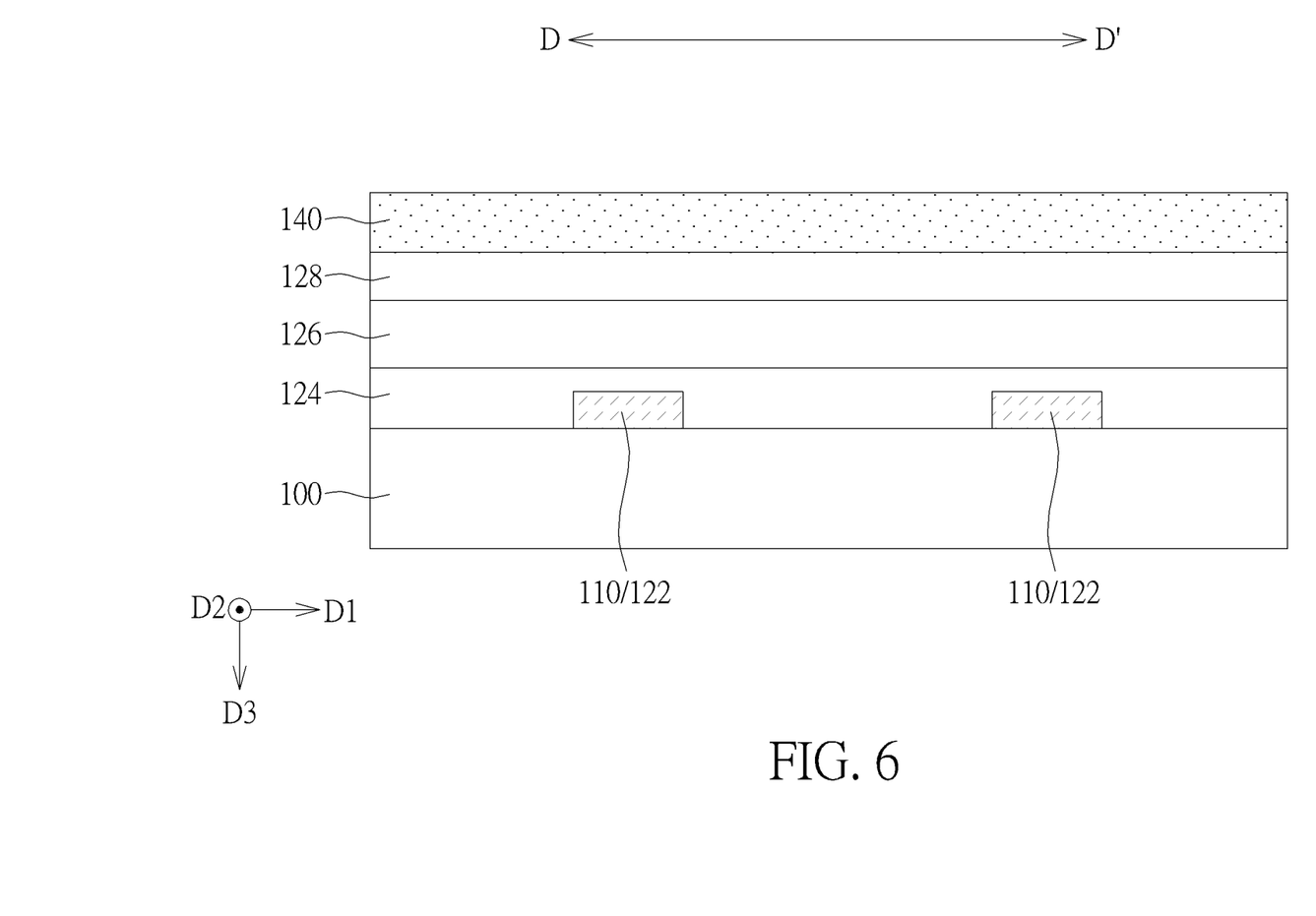
FIG. 6 illustrates a schematic diagram of a sectional view along a section line D-D' in FIG. 4.

As shown in FIG. 1, the flexible display device 10 may include a transparent electrode 138 disposed in the peripheral region R2, and a portion of the transparent electrode 138 may extend into the active region R1, but not limited thereto. The transparent electrode 138 may be disposed on the transfer structures 108 or may at least partially cover the transfer structures 108. The transparent electrode 138 may protect components underneath, but not limited thereto. Please refer to FIG. 4 through FIG. 6. FIG. 4 is an enlarged schematic diagram of the transfer structure according to some embodiments of the present disclosure. FIG. 5 illustrates schematic diagrams of sectional views along a section line B-B' and a section line C-C' in FIG. 4. FIG. 6 illustrates a schematic diagram of a sectional view along a section line D-D' in FIG. 4. As shown in FIG. 4 and FIG. 5 and using one of the transfer structures 108 as an illustrative example, it may be noticed that a metal layer 142 may be disposed between the metal layer 122 and the insulating layer 126. More specifically, the metal layer 142 may be disposed between the insulating layer 124 and the insulating layer 126. As shown in FIG. 4, the data lines 104 may be linear portions of the metal layer 142 extended therefrom, and the data lines 104 may be directly connected to the metal layer 142 of the transfer structures 108, but not limited thereto. Furthermore, the conductive lines 110 (that is, the linear portions of the metal layer 122 extended therefrom) may be directly connected to the metal layer 122 of the transfer structures 108, but not limited thereto.

As shown in FIG. 5, the insulating layer 126 is disposed on the metal layer 142, and the via hole 144 may penetrate through the insulating layer 126 and expose a portion of the metal layer 142; the via hole 146 may penetrate through the insulating layer 124 and the insulating layer 126 and expose a portion of the metal layer 122. In some embodiments, the transparent electrode 130 may be disposed in the via hole 144 and the via hole 146, and the transparent electrode 130 may at least partially cover the top surface 1261 of the insulating layer 126, but not limited thereto. In some embodiments, the transparent electrode 130 may directly contact a portion of a surface of the metal layer 142 exposed by the via hole 144 and a portion of a surface of the metal layer 122 exposed by the via hole 146, so that the transparent electrode 130 may be electrically connected to the metal layer 122 through the via hole 146 and be electrically connected to the metal layer 142 through the via hole 144, but not limited thereto. The insulating layer 128 covers the transparent electrode 130, and the insulating layer 128 is disposed between the transparent electrode 138 and the transparent electrode 130. In some embodiments, as shown in FIG. 4, the data lines 104 and the conductive lines 110 may be electrically connected through the transfer structures 108. The metal layer 122 and the metal layer 142 shown in FIG. 5 may be electrically connected through the transparent electrode 130.

As shown in FIG. 5, the transparent electrode 130 on the via hole 144 may include a portion 130c and another portion 130d, wherein the portion 130c is disposed in the via hole 144, and the portion 130d is disposed on a portion 1261t of the top surface 1261 of the insulating layer 126. The transparent electrode 130 on the via hole 146 may include a portion 130e and another portion 130d, wherein the portion 130e is disposed in the via hole 146, and the portion 130d is disposed on a portion 1261r of the top surface 1261 of the insulating layer 126. In some embodiments, a top surface of the transparent electrode 130 on the via hole 144 and the via hole 146 may be concave surfaces. In the transfer structure 108 of the present embodiment, by reducing an area of the transparent electrode 130 (such as reducing the area to be less than an area of the metal layer 122 under the transparent electrode 130) to reduce the contact area of the heterogeneous interface between the transparent electrode 130 and the insulating layer 126 or reduce the contact area of the heterogeneous interface between the transparent electrode 130 and the insulating layer 128, the probability of peeling or cracking due to the heterogeneous interfaces between dissimilar materials may be reduced.

As shown in FIG. 1, the flexible display device 10 may include a transparent electrode 140 disposed in the peripheral region R2. The transparent electrode 140 may be disposed on the insulating layer 128. Along the second direction D2, the transparent electrode 140 may be disposed between the transparent electrode 138 and the integrated circuit chip 118, but not limited thereto. As shown in FIG. 4 and FIG. 6, the transparent electrode 140 may be disposed on the conductive lines 110 (the conductive lines 110 being the linear portions of the metal layer 122 in the peripheral region R2) or may at least cover a portion of the conductive lines 110, and the transparent electrode 140 covers a portion of the conductive lines 110 and exposes another portion of the conductive lines 110. The transparent electrode 140 may protect components underneath, but not limited thereto. In the flexible display device 10 of the present embodiment, no transparent electrodes (such as the transparent electrode 130) are disposed between the insulating layer 126 and the insulating layer 128 under the transparent electrode 140; in this manner, heterogeneous interfaces between transparent electrodes and the insulating layer 126 or between transparent electrodes and the insulating layer 128 may be reduced, thereby reducing the probability of peeling or cracking due to the heterogeneous interfaces between dissimilar materials. Additionally, quantities and positions of the transparent electrode 138 and the transparent electrode 140 of the present disclosure are not limited to those shown in FIG. 1.

In the present embodiment, the metal layer 122 and the metal layer 142 may include a single-layered structure or a multi-layered structure. The metal layer 122 and the metal layer 142 may include metals (such as silver (Ag), copper (Cu), aluminum (Al), molybdenum (Mo) or alloys thereof), metal oxides, metal nitrides, other suitable conductive materials or a combination of aforementioned materials, but not limited thereto. In some embodiments, the metal layer 122 may for example be a two-layered structure including aluminum and molybdenum or aluminum and molybdenum nitride ($Mo_2N$), and the metal layer 142 may for example be a three-layered structure including molybdenum/aluminum/molybdenum or molybdenum nitride/aluminum/molybdenum nitride, but not limited thereto.

The insulating layer 124, the insulating layer 126 and the insulating layer 128 may include a single-layered structure or a multi-layered structure. Materials for the insulating layer 124, the insulating layer 126 and the insulating layer 128 may include inorganic insulating materials and organic insulating materials. Silicon oxide (SiO), silicon nitride (SiN), silicon oxynitride (SiON), other suitable insulating materials or combinations thereof are illustrative examples of inorganic insulating materials, but not limited thereto. Organic resin, organic polymer film on array (organic PFA), other suitable insulating materials or combinations thereof are illustrative examples of organic insulating materials, but not limited thereto. In some embodiments, the insulating layer 124 may be a gate insulating layer, wherein the gate insulating layer may for example be a single layer including silicon nitride or a three-layered structure of silicon nitride/amorphous silicon/n-type doped silicon, but not limited thereto. The insulating layer 126 and the insulating layer 128 may for example be a single layer including silicon nitride, but not limited thereto.

Materials for the transparent electrode 130, the transparent electrode 132, the transparent electrode 138 and the transparent electrode 140 may include indium tin oxide (ITO), indium zinc oxide (IZO), indium gallium zinc oxide (IGZO), indium tin zinc oxide (ITZO), antimony tin oxide (ATO), antimony zinc oxide (AZO), other suitable transparent conductive materials or combinations of aforementioned materials, but not limited thereto.

Subsequent paragraphs will continue to detail other embodiments of the present disclosure. For simplicity, identical elements will be denoted by the same reference signs. To illustrate the differences between various embodiments, the differences between various embodiments will be described in more detail in the following paragraphs while omitting descriptions regarding previously discussed features.

Figure 7:
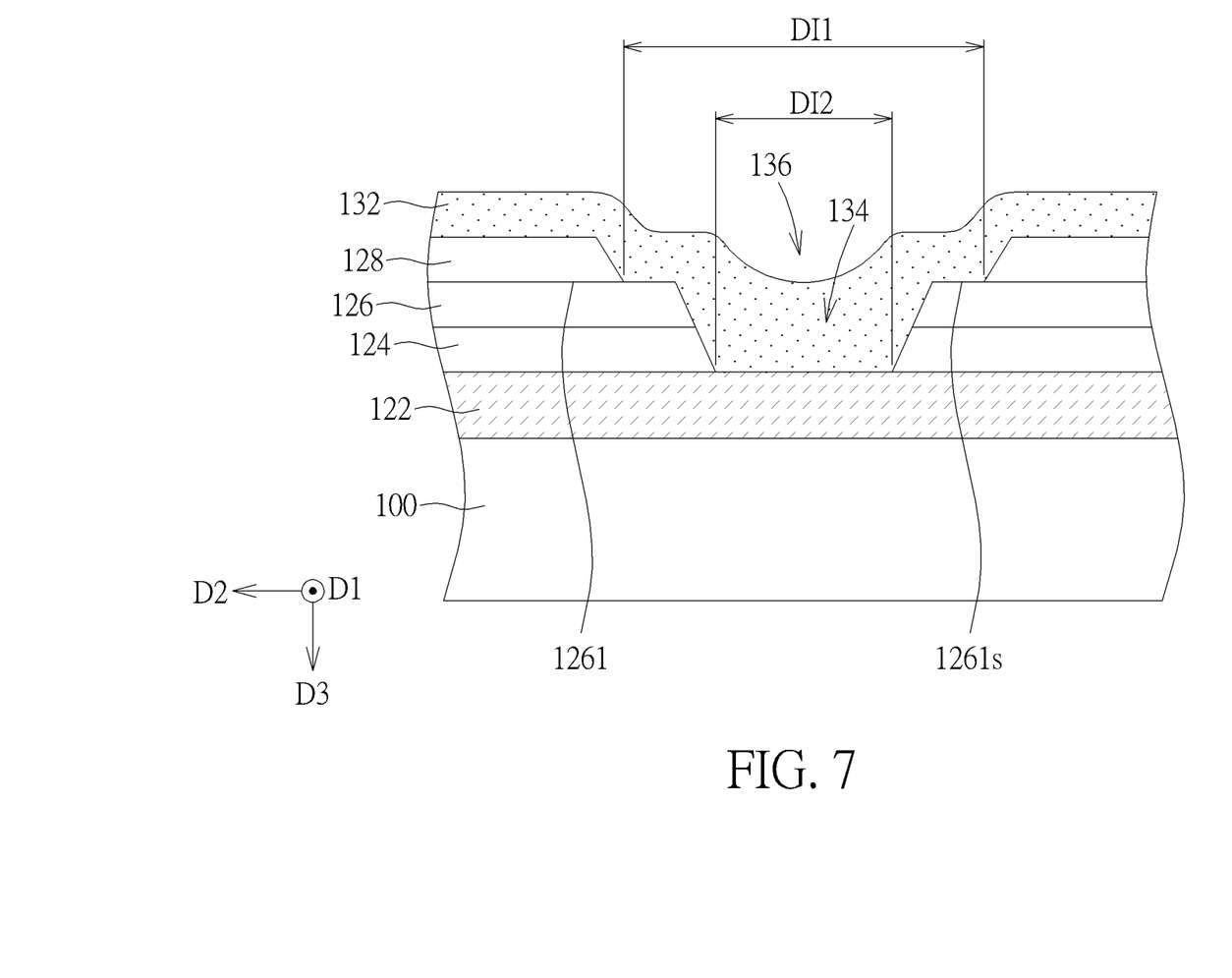
FIG. 7 is a schematic diagram showing a partial sectional view of one of the bonding pads according to some embodiments of the present disclosure.

Please refer to FIG. 7, which is a schematic diagram showing a partial sectional view of one of the bonding pads according to some embodiments of the present disclosure. FIG. 7 may illustrate a sectional structure of the via hole 134 and the via hole 136 of the bonding pads 114 or the bonding pads 112 according to above embodiments. The via holes 134 of the present embodiments are not disposed with the transparent electrodes 130; only the transparent electrodes 132 fill in the via holes 134 and the via holes 136 and directly contact the metal layer 122.

Figure 8:
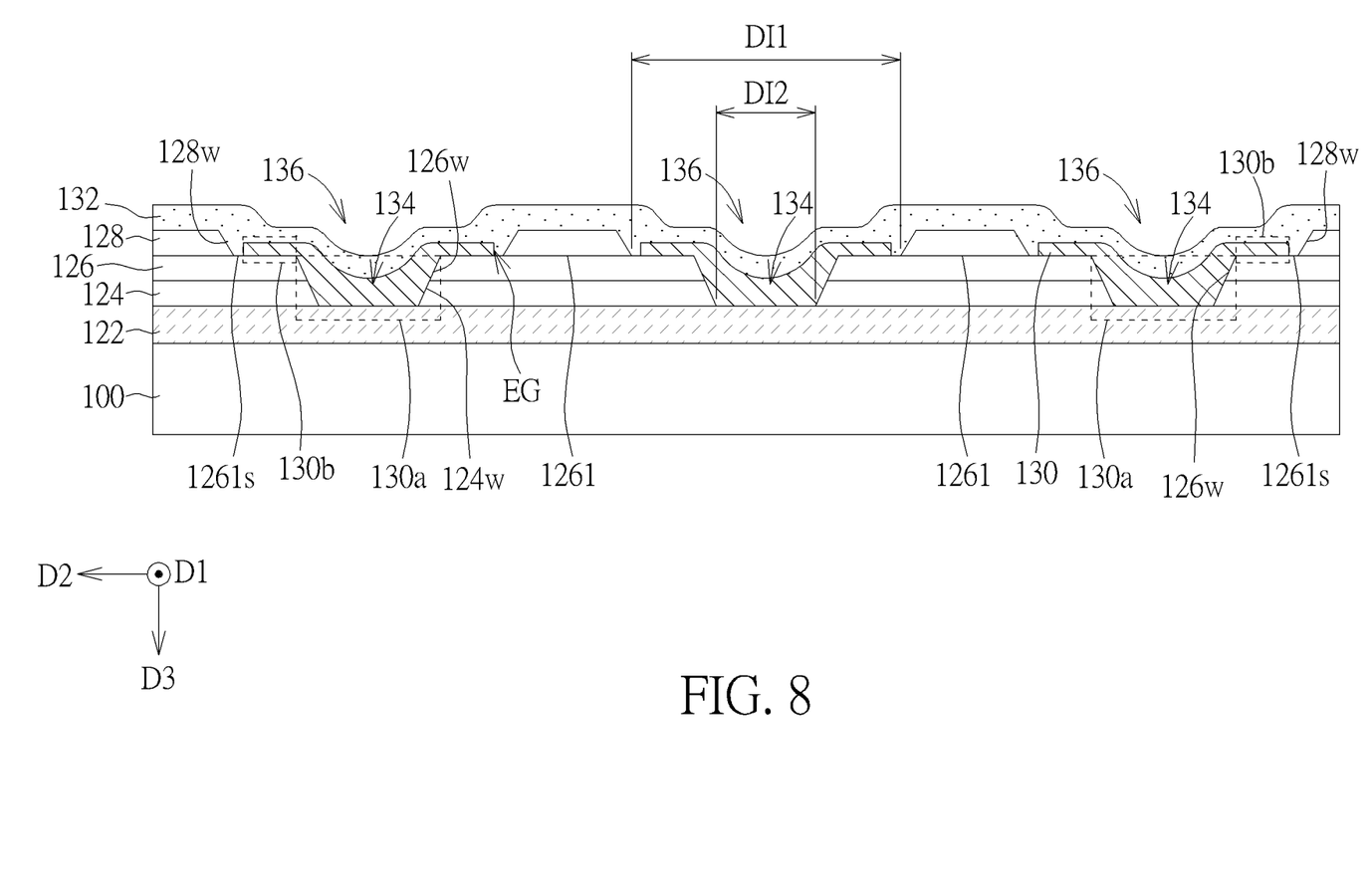
FIG. 8 is a schematic diagram showing a partial sectional view of one of the bonding pads according to some embodiments of the present disclosure.

Please refer to FIG. 8, which is a schematic diagram showing a partial sectional view of one of the bonding pads according to some embodiments of the present disclosure. The portion 130b of the transparent electrode 130 of the present embodiments may be disposed on the portion 126_1s of the top surface 126_1 of the insulating layer 126 exposed by the via holes 136, and partially cover the portion 126_1s of the top surface 126_1. Therefore, a portion of the portion 126_1s of the top surface 126_1 may not be covered by the portion 130b of the transparent electrode 130, or an edge EG of the portion 130b of the transparent electrode 130 may be disposed between the side wall 128w and the side wall 126w, but not limited thereto.

In summary, in the bonding pads of the electronic device or the flexible display device of the present disclosure, one of the layers of the transparent electrodes is not a layer that is formed continuously on the insulating layer but a layer of a plurality of separable electrodes. The transparent electrodes may be separately disposed in corresponding via holes and partially cover portions of the top surface of the insulating layer that are adjacent to the via holes. In this manner, the contact area of the heterogeneous interface between the transparent electrode and the insulating layer above or below the transparent electrode may be reduced, such that the probability of peeling or cracking due to the heterogeneous interfaces between dissimilar materials may be reduced. Furthermore, at the transfer structures in the peripheral region or at locations above some conductive lines, the area of the transparent electrode may be reduced to reduce the contact area of the heterogeneous interface between the transparent electrode and the insulating layer, such that the probability of peeling or cracking due to the heterogeneous interfaces between dissimilar materials may be reduced.

Even though embodiments and advantages of the present disclosure have been described as above, it should be understood that the description does not limit the scope of the present disclosure. Those skilled in the art may modify, substitute, combine or amend features of the present disclosure without departing from the essence and scope of the present disclosure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flexible display device, comprising:
   a substrate comprising an active region and a peripheral region adjacent to the active region;
   a first metal layer disposed on the substrate;
   a first insulating layer disposed on the first metal layer and comprising a first via hole in the peripheral region;
   a second insulating layer disposed on the first insulating layer and comprising a second via hole;
   a second metal layer disposed between the first metal layer and the first insulating layer;
   a third via hole penetrating through the first insulating layer and exposing a portion of the second metal layer;
   a fourth via hole penetrating through the first insulating layer and exposing a portion of the first metal layer; and
   a first transparent electrode disposed on the first insulating layer, wherein the first transparent electrode is electrically connected to the first metal layer through the fourth via hole and electrically connected to the second metal layer through the third via hole,
   wherein the first via hole is disposed within the second via hole and the second via hole exposes a portion of a top surface of the first insulating layer in a top view direction of the flexible display device.

2. The flexible display device according to claim 1, further comprising a second transparent electrode electrically connected to the first metal layer through the second via hole and the first via hole.

3. The flexible display device according to claim 2, wherein the second transparent electrode directly contacts the first metal layer.

4. The flexible display device according to claim 2, further comprising a third transparent electrode disposed in the first via hole, wherein the second transparent electrode is electrically connected to the first metal layer via the third transparent electrode.

5. The flexible display device according to claim 1, wherein the first insulating layer further comprises a third via hole adjacent to the first via hole, the second insulating layer further comprises a fourth via hole adjacent to the second via hole, and the third via hole is disposed within the fourth via hole in the top view direction of the flexible display device.

6. The flexible display device according to claim 5, further comprising a second transparent electrode and a plurality of third transparent electrodes, one of the plurality of third transparent electrodes is disposed within the first via hole, another one of the plurality of third transparent electrodes is disposed within the third via hole, and one of the plurality of third transparent electrodes is separate from another one of the plurality of third transparent electrodes.

7. The flexible display device according to claim 6, wherein the second transparent electrode is electrically connected to the first metal layer through one of the plurality of third transparent electrodes and another one of the plurality of third transparent electrodes.

8. The flexible display device according to claim 1, further comprising a third transparent electrode comprising a first portion and a second portion, wherein the first portion is disposed in the first via hole and the second portion is disposed on the portion of the top surface of the first insulating layer.

9. The flexible display device according to claim 8, wherein the first insulating layer comprises a first side wall, the second insulating layer comprises a second side wall, the second portion of the third transparent electrode comprises an edge, and the edge of the second portion of the third transparent electrode projected on the substrate is disposed between the second side wall of the second insulating layer projected on the substrate and the first side wall of the first insulating layer projected on the substrate.

10. The flexible display device according to claim 1, wherein a diameter of the second via hole is greater than or equal to 15 micrometers and less than or equal to 20 micrometers.

11. The flexible display device according to claim 1, wherein the second insulating layer comprises a side wall surrounding the second via hole, and an angle between the side wall and the substrate is greater than or equal to 45 degrees and less than or equal to 60 degrees.

12. The flexible display device according to claim 1, further comprising a fourth transparent electrode, wherein the first metal layer comprises a linear portion and the fourth transparent electrode is disposed on the linear portion.

13. The flexible display device according to claim 12, wherein the fourth transparent electrode is disposed on the second insulating layer.

14. The flexible display device according to claim 1, wherein the first insulating layer comprises a side wall surrounding the first via hole, and an angle between the side wall and the substrate is greater than or equal to 45 degrees and less than or equal to 60 degrees.

15. The flexible display device according to claim 12, wherein the fourth transparent electrode covers a portion of the linear portion and exposes another portion of the linear portion.

16. The flexible display device according to claim 1, wherein a diameter of the second via hole is greater than a diameter of the first via hole.

17. The flexible display device according to claim 1, wherein the first transparent electrode comprises a first portion, a second portion and a third portion, wherein the first portion is disposed within the third via hole, the second portion is disposed within the fourth via hole, and the third portion is disposed on a portion of a top surface of the first insulating layer.

18. The flexible display device according to claim 1, further comprising a fifth transparent electrode, wherein the second insulating layer is disposed between the fifth transparent electrode and the first transparent electrode.

* * * * *